(12) United States Patent
Mirow et al.

(10) Patent No.: US 6,470,295 B1
(45) Date of Patent: Oct. 22, 2002

(54) METHOD FOR DISPLAYING STATISTICALLY OCCURRING EVENTS

(75) Inventors: Georg Dieter Mirow, Schriesheim; Tilmann Krueger, Mutterstadt, both of (DE)

(73) Assignee: George Dieter Mirow, Schriesheim (DE)

(*) Notice: Subject to any disclaimer, the term of this patent is extended or adjusted under 35 U.S.C. 154(b) by 0 days.

(21) Appl. No.: 09/424,879

(22) PCT Filed: Jun. 5, 1998

(86) PCT No.: PCT/EP98/03390

§ 371 (c)(1),
(2), (4) Date: Dec. 10, 1999

(87) PCT Pub. No.: WO98/57126

PCT Pub. Date: Dec. 17, 1998

(30) Foreign Application Priority Data

Jun. 12, 1997 (DE) .......................................... 197 24 742

(51) Int. Cl.[7] .................................................. G04F 3/00
(52) U.S. Cl. ................................... 702/176; 702/178
(58) Field of Search .................. 235/92; 364/569; 324/78; 395/550; 368/113; 360/51; 702/176, 178

(56) References Cited

U.S. PATENT DOCUMENTS

| 4,090,082 A | | 5/1978 | Marshall, III et al. ...... 250/375 |
|---|---|---|---|
| 4,150,432 A | * | 4/1979 | Sorden ........................ 364/484 |
| 4,165,459 A | * | 8/1979 | Curtice ........................ 235/92 |
| 4,395,762 A | * | 7/1983 | Wondergem et al. ....... 364/484 |
| 4,587,482 A | * | 5/1986 | Hasegawa .................... 324/78 |
| 4,642,463 A | | 2/1987 | Thoms |
| 4,837,705 A | | 6/1989 | Mussler et al. ............. 364/484 |
| 5,128,607 A | * | 7/1992 | Clark et al. ................ 324/78 D |
| 5,233,545 A | * | 8/1993 | Ho et al. ..................... 364/569 |
| 5,313,622 A | * | 5/1994 | Truchard et al. ............ 395/550 |
| 6,101,055 A | * | 8/2000 | Chainer et al. ............... 360/51 |
| 6,226,231 B1 | * | 5/2001 | Kattan ........................ 368/113 |

FOREIGN PATENT DOCUMENTS

| DE | 30 25 489 | 1/1998 |
|---|---|---|
| EP | 0 387 415 | 9/1990 |

\* cited by examiner

Primary Examiner—Marc S. Hoff
Assistant Examiner—Felix Suarez
(74) Attorney, Agent, or Firm—Foley & Lardner

(57) ABSTRACT

The invention relates to a method for rapidly and accurately displaying the frequency of statistically occurring events, which method provides a display value after only a short period even in the case of low frequencies. The smoothing required for a high-resolution display when events occur at a low frequency is carried out with relatively little delay. It does not prevent a rapid change to higher display values when the frequency of events rises rapidly. Said method is therefore especially suitable for displaying statistically occurring immission and for traffic monitoring and control.

20 Claims, 4 Drawing Sheets

METHOD FOR DISPLAYING STATISTICALLY OCCURRING EVENTS

FIELD OF THE INVENTION

Indication method for statistically occurring events The invention relates to a method for indicating the frequency of statistically occurring events and devices for using the method. In the explanations below, the detection of radioactive radiation is assumed as an example of statistically occurring events. However, it is pointed out that the invention is not restricted to the specific kind of statistically occurring events, but rather may also serve, by way of example, for indicating the current traffic density in road traffic or the stream of visitors to facilities.

DESCRIPTION OF THE RELATED ART

An array of methods are known which are supposed to make it possible to represent the frequency of statistically occurring events in a meaningful manner.

Thus, the intensity of radioactive radiation is indicated by measuring devices with an analog direct-reading instrument by each pulse of the sensor being assigned a specific electric charge and the current resulting from the rate of charges which corresponds to the sensor pulse rate being conducted through the analog direct-reading instrument. If this direct-reading instrument is equipped with a sufficiently long mechanical time constant, then the resultant low-pass filtering produces an indication corresponding to the pulse rate.

The intensity of radioactive radiation is indicated by measuring devices with numerical indication by the number of pulses of the sensor being counted over a specific duration, for example one minute, and the number being indicated either continually or finally. The measurement time is often selected such that the indicated number of pulses corresponds to the rate with a unit selection.

Other devices do not have a time reference, but rather count the pulses continually from the beginning of a measurement to the end of a measurement, in order, for example, to be able to determine the total radiation load.

The published patent application 30 25 489 describes a device for measuring ionizing radiation which measures the time duration between the detected radiation pulses. Owing to the statistical behavior of ionizing radiation, the time interval between a plurality of radiation pulses is measured and the corresponding mean value is formed. The interval between two determinations of the mean value corresponds to the time interval between the first and last radiation pulse included in the averaging. Thus, a new measured value can be determined in a short time only at high rates.

U.S. Pat. No. 4,090,082 describes how, by taking account of the dead time of a Geiger-Müller counter tube, it is possible to improve the linearity of Geiger-Müller counters toward very high pulse rates and how the counting of pulses and its indication can expediently be effected. The dead time consideration is negligible or at least of secondary importance for Geiger-Müller counter tubes provided for an application outside highly loaded radiation areas. Thus, the dead time in the case of the known counter tube LND712 is 90 microseconds; the typical pulse rate in the case of environmental radioactivity is in the region of less than one pulse per second. If, by way of example, motor vehicles traveling past are used as events to be recorded, then the dead time consideration acquires considerable importance owing to the relatively high event rate in that case for many sensors.

U.S. Pat. No. 4,837,705 describes a method for calculating the rate of change of the frequency of statistical events. This explains how difficult it is to ascertain how rapidly the neutron rate in a nuclear reactor is increasing or decreasing, because in order to determine it accurately, as is necessary for the purpose of controlling and monitoring nuclear power stations, a long measurement duration is necessary and also tenable in the case of a low frequency of statistical events, while accurate determination is possible rapidly and is also necessary in the case of a high frequency.

The methods known to date are affected by many problems which limit their use or even make them dangerous to use. Thus, although analog measuring devices are still suitable for fast indication, they are not suitable for accurate evaluation or for long-term integration of the measured radiation. The numerical measuring devices based on counters are not suitable for fast indication of radiation that has increased to a great extent. For this reason, they are often combined with acoustic indication, which is intended to inform the observer about the present intensity of the radiation.

For the purpose of temporally resolved logging, a number of measuring devices are provided with an analog output which supplies a signal that corresponds to the current pulse rate and can be recorded. One disadvantage of such logging is that the handling of the measurements is made more difficult and its evaluation becomes costly and complicated.

SUMMARY OF THE INVENTION

In the case of the methods used in nuclear power stations, the technical outlay for determining indication values is of only secondary importance. Thus, U.S. Pat. No. 4,837,705 specifies that, by way of example, the pulses are in each case counted for a tenth of a second and 16,640 such counts are stored and used for determining measured values.

A further problem is that although the measuring devices indicate the current or the averaged rate of the radiation, they do not indicate the permissible residence duration linked to the indicated rate. The sensitivity of Geiger-Müller counter tubes used as sensor is usually specified in pulse rate per dose, for example in 1.8 pulses per second for each microsievert per hour. This corresponds to 6480 pulses per microsievert. The permissible annual dose for personnel professionally exposed to radiation is for example 50 millisievert in Germany, from which the sensor pulse number corresponding to this annual dose can be determined in a customary manner, 324,000,000 pulses in the example. The permissible residence duration results, as is generally known, from this pulse number referring to a year and divided by the currently measured pulse rate. Thus, in the example, a pulse rate of about 20 pulses per second produces a permissible residence duration of half a year.

The object of the invention is to avoid the disadvantages of the known methods and devices and to make it possible that firstly, on the one hand, indication values which are as accurate as possible are displayed as fast as possible and, secondly, the rate and the permissible residence duration are indicated.

According to the invention, the above object is achieved by means of a method according to claim 1. In order to indicate the rate of the pulses output by the sensor, the rate corresponding to the rate of recorded events, for each individual pulse the current time period is in each case defined as a temporal feature and either the latter is stored and the indication values and their representation are calculated from the stored features or, for each time period, the pulses assigned thereto are counted and these numbers are stored and the indication values and their representation are calculated therefrom. For simultaneous graphical representation of the pulse rate and the permissible residence duration, a nonlinear, for example a logarithmic, graphical indication of the pulse rate in a bar with dual scaling, in opposite directions, for the pulse rate and the permissible residence duration is performed.

In one refinement of the invention, the point in time at which the pulse occurs, for example with a resolution of one second, is determined as the temporal feature of said pulse and is stored in a circulating memory having a specific number of memory locations. At the respective point in time of a desired indication, the difference between the current time and the oldest time stored in the circulating memory is formed and the number of memory locations is divided by this and indicated as the rate, if appropriate scaled with a factor. Furthermore, the number of pulses is counted in a counter and stored for logging purposes at intervals with the current temporal feature.

The position of the oldest time in the circulating memory corresponds to that at which the temporal feature of the next pulse is to be entered. The essential advantage of this refinement is that even given a low rate, an indication with indication values having relatively little variation is achieved and, if the radiation increases, the indication immediately increases and reaches its final steady-state value with a shorter and shorter averaging time.

When a device according to the invention is switched on, the indicated value is incorrect until the circulating buffer has been filled for the first time.

In a first further refinement of the invention, therefore, until the circulating buffer has been completely filled for the first time, the switch-on point in time is used as the oldest time and the current number of used memory locations is used as the number of memory locations. This means that the indication initially varies more greatly owing to the initially smaller number of pulses which contributes to the averaging.

In a second further refinement of the invention, when the measuring device is switched on, in accordance with the expected rate, pre-allocation of the memory locations is carried out with previous temporal features corresponding to the rate. As a result, the variation of the indication corresponds to steady-state behavior even directly after the switch-on.

In one refinement of the invention, a time period whose formation is based on a clock cycle, for example with a clock period of one second, is selected as the temporal feature of the pulse, and the numbers of pulses occurring per second are stored in a circulating memory having a specific number of memory locations. At the respective point in time of a desired indication, the sum of the numbers stored in the memory locations is divided by the number of memory locations and indicated as the rate, if appropriate scaled with a factor. If the number of memory locations is selected skillfully, for example 64 if binary numbers are used or for example 100 if decimal numbers are used, point shifting is sufficient so that explicit division can be dispensed with. The essential advantage of this refinement is that an indication with indication values having very little variation is achieved at a high rate.

In a further refinement, each pulse is given a consecutive number and the number of the pulse is stored in the position corresponding to the current time period in the circulating memory. As a result, it is no longer necessary to calculate the sum of all the numbers stored in the memory locations, but rather only the difference between the current pulse number and the oldest stored one, which is in the memory position to be written to next.

In one refinement of the invention, a first circulating memory is allocated the points in time of the pulses, and a second circulating memory is allocated the number of pulses per clock cycle. As long as the number of pulses in the second circulating memory does not reach or exceed a selected limit value, the rate is determined according to a method described above, otherwise according to a second of the methods described above. The effect achieved by this is that the averaging time is different at a relatively low rate than at a relatively high rate; for example inversely proportional to the pulse rate at a relatively low rate and constant at a relatively high rate. As a result, a relatively fast and well smoothed indication is achieved at a relatively low rate and a relative improvement in the smoothing without a disturbing delay in the indication is achieved at a relatively high rate. The limit used for changing over between the two methods may be selectable by the user of the method. For many applications, a value corresponding to twice the natural radiation will be suitable for this purpose. This value may also be adaptively incorporated by a device.

The resolution that can be attained for the rate depends on the sensitivity of the sensor and on the averaging time used. In the case of a logarithmic bar representation, therefore, the indicated bar length becomes smoother and smoother, the greater the rate is. For a numerical indication, an indication resolution corresponding to the averaging time currently used in each case is selected in one refinement of the invention.

The invention makes it possible to read at any time from the length, displayed in the indication, of a single indication bar both the current rate and the permissible residence duration, for example 2 millisieverts per hour for the rate and 1 day for the permissible residence duration. This applies even directly after the switch-on, without unreasonable variation of the indication occurring. In this case, a large range can be displayed appropriately.

If the method according to the invention is realized in a discrete signal processing technology, then it makes suitable signals available for the continual logging of pulse rates and total number of pulses with the assigned reference times.

If a vehicle moving past is regarded as the event to be recorded and an induction loop, for example, is used as the sensor, then the method can be applied particularly well in traffic counting for the purpose of assessing the road traffic density.

Further advantageous refinements emerge from the following description of exemplary embodiments. In the drawings:

DETAILED DESCRIPTION OF THE PREFERRED EMBODIMENTS

Figure 1:
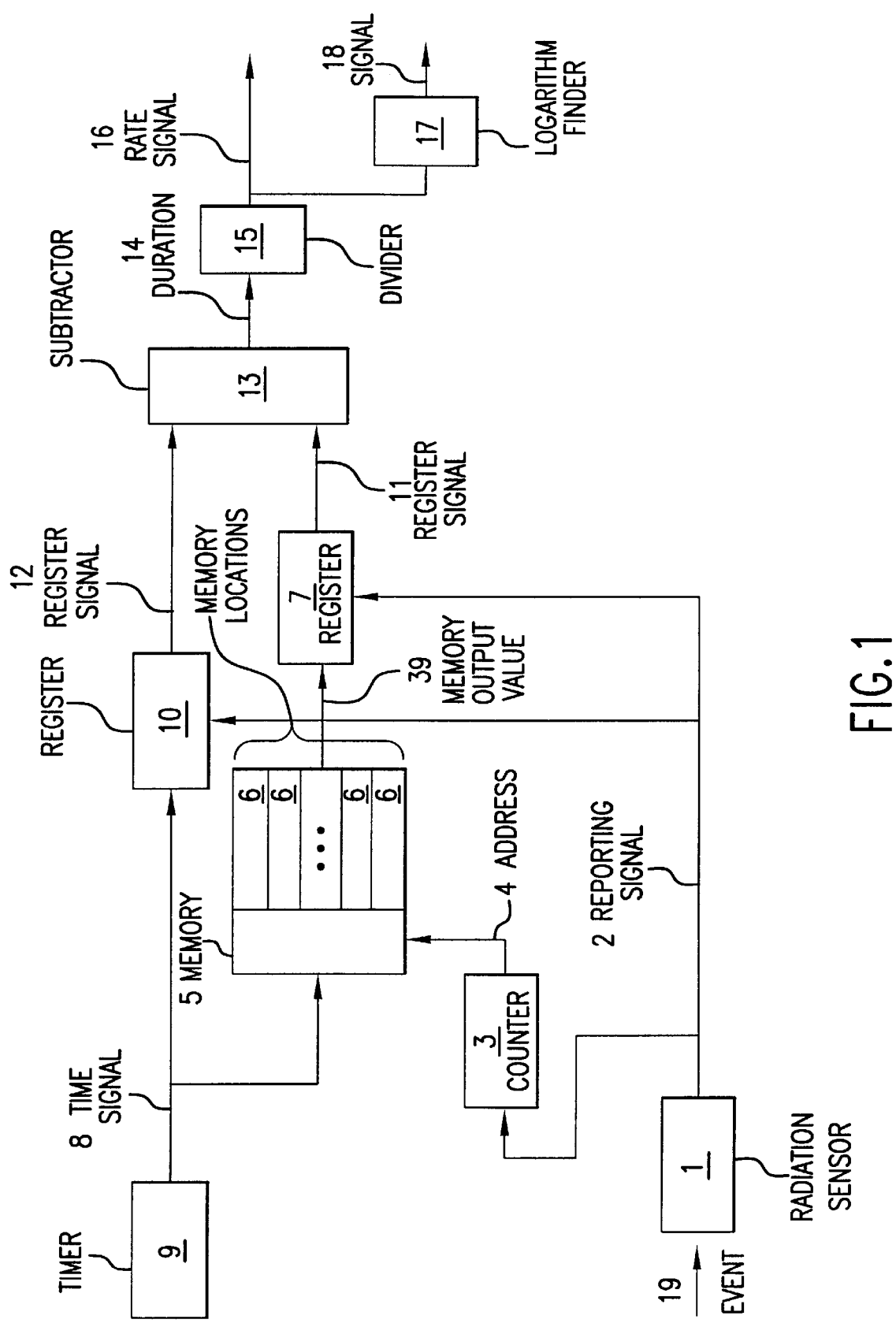
FIG. 1 shows a typical device for carrying out the method according to the invention.

A typical arrangement of a configuration of the invention is illustrated in FIG. 1. The radiation sensor 1 records in a generally known manner a statistically occurring event 19, in the case of radiation, for example, a radiation particle incident on the sensor, and generates, as reporting signal 2, a pulse reporting the event. This pulse increments the counter 3 by one. As a result of the capacity limiting of the counter 3, the latter is a circulating counter which, when its maximum value Nmax has been exceeded, starts again from the beginning. The content of the counter 3 forms the address 4 of the memory 5, which has a number of memory locations 6 which corresponds to the maximum value Nmax of the counter 3. By means of an edge of the pulsed reporting signal 2, the content of the memory location 6 addressed by the address 4 is transferred to the register 7 and the current time signal 8 of the timer 9 is written to the same memory location 6 and to the register 10. The content of the register 7 represents the point in time of the earliest event 2 still recorded in the memory 5 and is fed as signal 11 to the subtractor 13; the content of the register 10 represents the point in time of the most recent event 2 yet to be recorded in the memory 5 and is fed as signal 12 to the subtractor 13. The output signal of the subtractor 13 represents the duration 14 which was necessary for the last Nmax+1 events 2. From this, the rate signal 16 is formed in the divider 15 by the division of an optionally selectable constant (not illustrated here) by the duration 14. The rate signal 16 can be indicated directly. It is logarithmized by the logarithm finder 17 with the assistance of an optionally selectable reference constant (not illustrated here) and displayed as signal 18, preferably on a graphical pointer-type or bar display, as illustrated in FIGS. 4 to 6.

Figure 2:
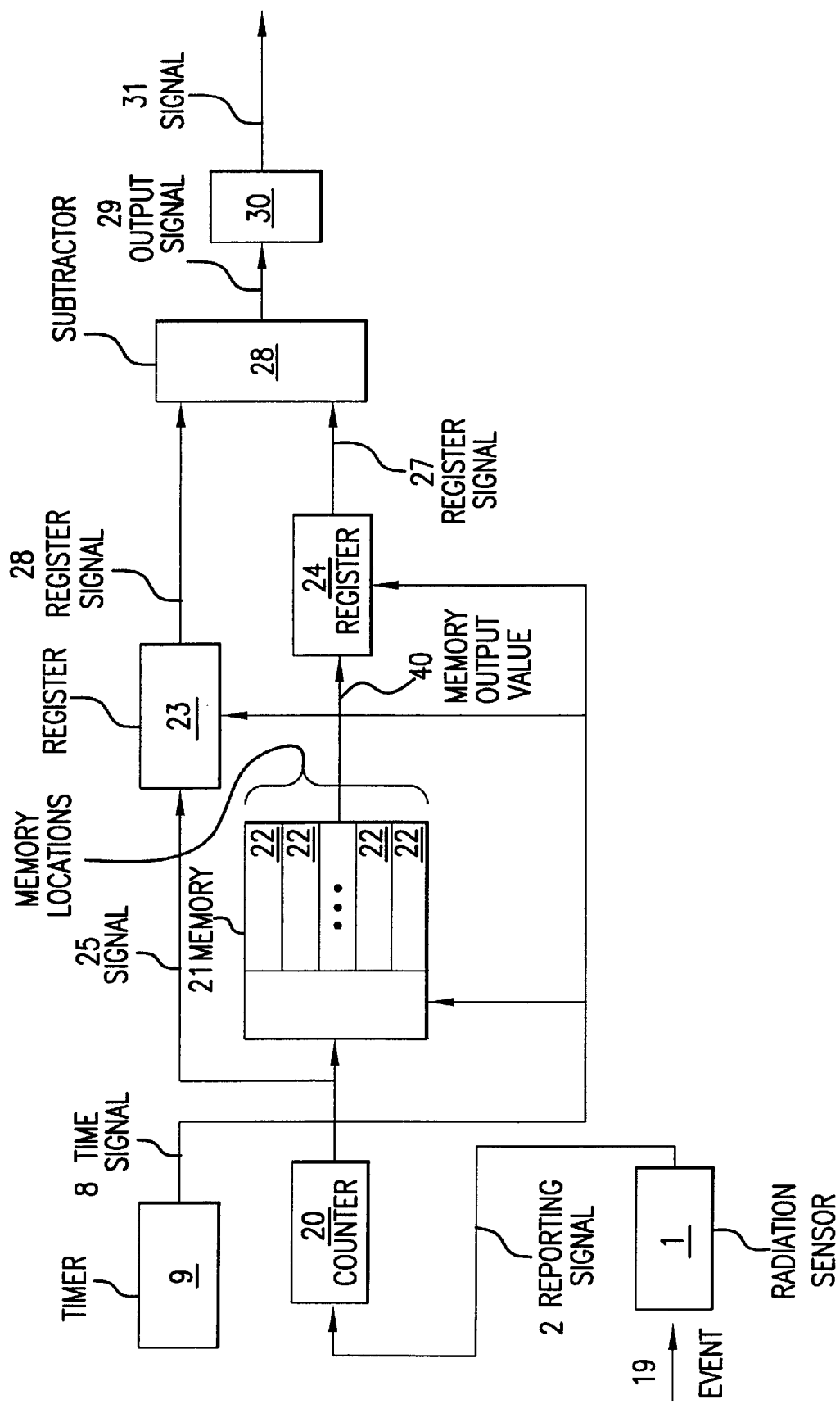
FIG. 2 shows a further device for carrying out the method according to the invention.

A further typical arrangement of a configuration of the invention is illustrated in FIG. 2. The sensor 1 records an event 19 and generates, as reporting signal 2, a pulse reporting the event. This pulse increments the counter 20 by one. The time signal 8 of the timer 9 forms the address of the memory 21, which has a number of memory locations 22 which corresponds to the averaging time, divided by the period of the timer 9. As a result of a change in the time signal 8, the content of the memory location 22 addressed by the time signal 8 is transferred to the register 24 and the output signal 25 of the counter 20 is written, as the number of the current event 19, to the same memory location 22 and to the register 24. The content of the register 24 represents the number of the earliest events 19 still recorded in the memory 21 and is fed as signal 27 to the subtractor 28; the content of the register 23 represents the number of the most recent events 19 yet to be recorded in the memory 21 and is fed as signal 26 to the subtractor 28. The output signal 29 of the subtractor 28 represents the number of events 19 which has been recorded by the sensor 1 during the averaging time and counted by the counter 20, and is thus a rate signal. In a multiplier or divider (not illustrated), the rate signal 29 can be adapted to selectable units of measurement with an optionally selectable constant (not illustrated here). The rate signal 16 can be directly indicated. It is logarithmized by the logarithm finder 30 with the assistance of an optionally selectable reference constant (not illustrated here) and displayed as signal 31.

Figure 3:
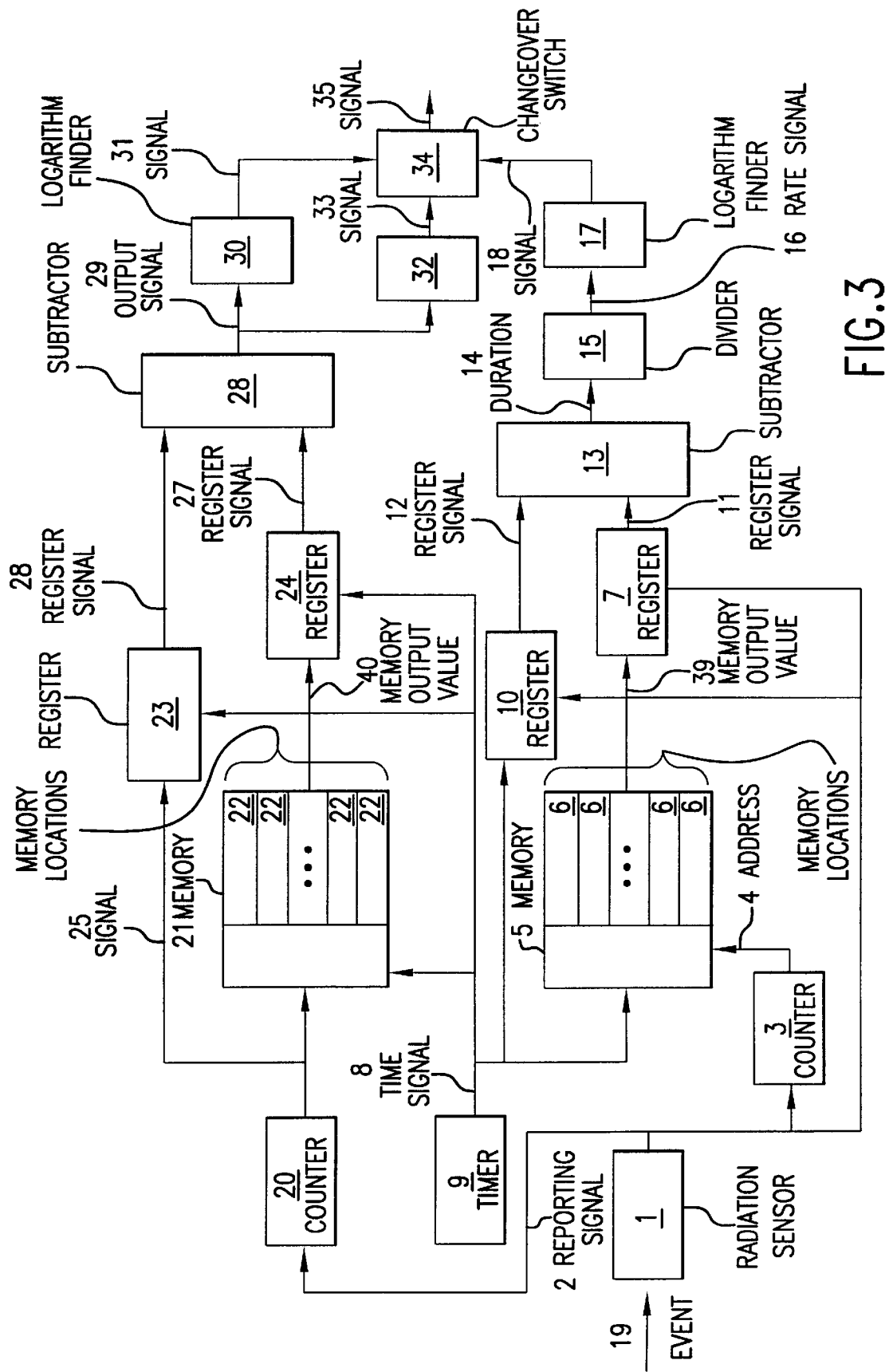
FIG. 3 shows a combination of the devices according to FIGS. 1 and 2.

A combination of the two arrangements corresponding to FIG. 1 and FIG. 2 is illustrated in FIG. 3. The rate signal 29 is compared with an optionally selectable limit value (not illustrated) in the limit value checker 32. If it exceeds said limit value, then a comparatively high event rate is present; consequently, the relative statistical variation range of the rate signal is so small that an accurate indication is achieved by the signal 31 and the latter is selected as indication signal 35 by the changeover switch 34 from the two signals 18 and 31. In the other case, there are relatively long time intervals between the events 19 recorded by the sensor 1; the signal 18 corresponds to the average rate of the last Nmax recorded events, with the result that the signal 18 switched to the display in this case by the changeover switch 34 affords a minimum accuracy corresponding to Nmax.

Figure 4:
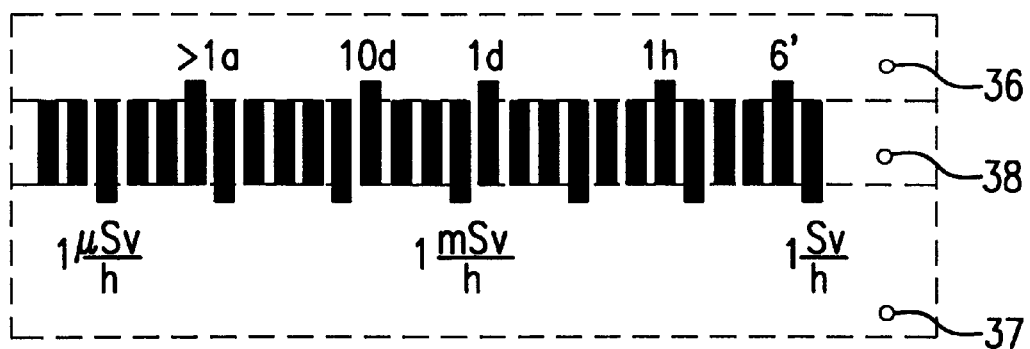
FIG. 4 shows the classification of a display according to the invention.
Figure 5:
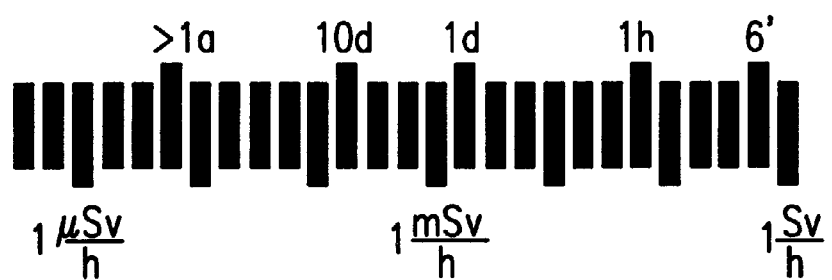
FIG. 5 shows the representation of a display driven at the maximum level.
Figure 6:
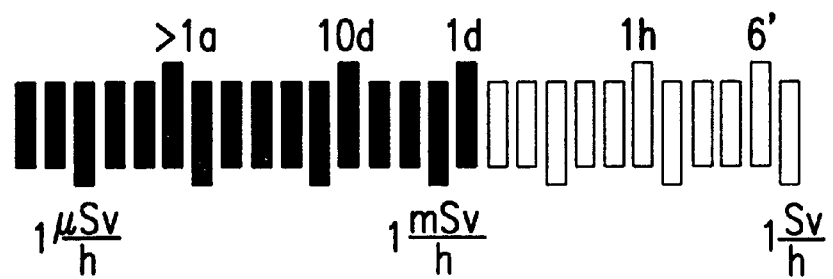
FIG. 6 shows the representation of a partly driven display.

A typical configuration of a bar display for simultaneously indicating the current rate and the permissible residence duration for this is illustrated in FIGS. 4 to 6, FIG. 4 illustrating the constituent parts of first scale 36, containing permissible residence durations in the example, second scale 37, exhibiting dose equivalent rates corresponding to a rate in the example, and bar graph 38, consisting of 27 segments in the example.

FIG. 5 illustrates driving at the maximum level and FIG. 6 illustrates partial driving, which can be read in the context of the bar resolution for the rate at "2 mSv/h" and for the permissible residence duration at "1d".

The bar illustrated in FIGS. 4 to 6 consists for example of 27 bar segments and the rate inscription consists of customary abbreviations for customary rate units "microsievert per hour", "millisievert per hour" and "sievert per hour", and the inscription of the permissible residence duration consists of customary abbreviations for customary durations "year", "ten days", "day", "hour" and "six minutes".

Other rate units, time units, bar resolutions, configurations, for example in the form of a round scale, also lie within the scope of the invention. The resolutions and configuration features used in the example illustrated in FIGS. 2 and 3 are typical of liquid crystal displays and vacuum fluorescent displays, where it is often necessary to manage with as few segments as possible for economical reasons.

The respective reference scale is made recognizable by the lengthening of individual bar segments. It is also possible to realize said scale separately. In the example, the scaling is selected to be logarithmic, with a resolution of four segments per decade. As a result, a range of almost seven decades can be appropriately represented with 27 segments. Thus, the display in FIG. 3 [sic] indicates a rate of about 2 millisieverts per hour and a permissible residence duration of one day. In parallel, it is possible to represent the exact rate in an additional numerical indication which may also be concomitantly included in the same display element.

List of reference symbols 1 radiation sensor
2 reporting signal
3 counter
4 address of the
5 memory 5
6 memory
7 memory location
8 register
9 time signal
10 timer
11, 12 register signal (point in
13 time of an event)
14 subtractor 15 duration
16 divider
17 rate signal
18 logarithm finder logarithmized rate
19 signal event
20 counter
21 memory
22 memory location
23,24 register
25–27 signal (number of an event)
28 subtractor
29 rate signal
30 logarithm finder
31 logarithmized rate signal
32 limit value checker
33 selection signal
34 changeover switch
35 indication signal
36,37 scale
38 indication bar
39 output value of the memory 5
40 output value of the memory 21
Nmax maximum value of the counter 3

What is claimed is:

1. Method for indicating the frequency of occurring events, characterized in that first of all each event is assigned a time period in the form of a time signal as a temporal feature, then this time signal is stored in a first memory, operated as a circulating memory, and a rate signal as an indication value for the rate is determined from the respectively stored values by the number of memory locations of the first memory being divided by the duration as the difference between the current time signal and the signal corresponding to the oldest time signal stored in the first memory, or, for each time period as time with a uniform time signal, the number of events which is assigned thereto is determined and stored in a second memory, operated as a circulating memory, and a rate signal as an indication value for the rate is determined from the respectively stored values by the sum of the numbers of events which are stored at the memory locations of the second memory being divided by the number of memory locations of the second memory.

2. Method according to claim 1, wherein each event is consecutively numbered, the respective number of the last of a number of events in a time period is determined and stored in the second memory and a rate signal as an indication value for the rate is determined from the respectively stored values by the difference between the number of the last event that occurred in the current time period and the number of an event which is associated with the oldest time period held in the second memory being divided by the number of memory locations of the second memory.

3. Method according to claim 1, wherein as a function of the number of events stored in the second circulating memory, an operating mode changeover is performed in which, in the event of a selectable limit value being exceeded for the number of events in the second circulating memory, the indication value is determined from the respectively stored values of said second circulating memory, otherwise from the stored values of the first circulating memory.

4. Method according to claim 1, wherein the circulating memories are initially preallocated.

5. Method according to claim 1, wherein the indication value determined corresponds to a rate, said indication value is deformed nonlinearly, and indicated graphically, the indication having two scalings, the first of which proceeds with the rising indication value and scales an event rate, while the second proceeds in the opposite direction and scales the mean time interval between the events or a permissible residence duration.

6. Apparatus for indicating the frequency of occurring events, comprising:
   a) a counter with capacity limiting is connected to a sensor not belonging to the apparatus;
   b) the sensor is furthermore connected to a first register and to a second register;
   c) the counter is connected to an address input of a memory and a timer to a data input of the memory in such a way that an output signal of the counter, as an address, selects a memory location which can have a time signal of the timer continuously written to it;
   d) a second register is likewise connected to the timer;
   e) the memory has a number of memory locations corresponding to the maximum value Nmax of the counter;
   f) the content of the addressed memory location of the memory can be transferred to the first register by the reporting signal of the sensor, the time signal of the timer simultaneously being written to the same memory location and to the register;
   g) the register is connected to a subtractor for the purpose of transferring its content, representing the point in time of the earliest event still recorded in the memory, as the signal, and so is the register, whose content represents the point in time of the most recent event yet to be recorded in the memory;
   h) a divider is connected to the subtractor, a rate signal that can be indicated being formed in said divider by division by a constant.

7. Apparatus according to claim 6, wherein a divider is connected to the subtractor, a rate signal that can be indicated being formed in said divider by division by a constant.

8. Apparatus according to claim 7, wherein the constant is freely selectable.

9. Apparatus according to claim 6, wherein a logarithm finder is connected to the divider.

10. Apparatus according to claim 9, wherein the logarithm finder effects logarithm finding with a reference constant.

11. Apparatus according to claim 9, wherein a graphical pointer-type or bar display is connected to the logarithm finder.

12. Apparatus according to claim 11, wherein the pointer-type or bar display has at least two scalings, of which at least one identifies an event rate, and another a time interval or a permissible duration.

13. Apparatus according to claim 7, in which:
   a) a first rate signal can be fed to a limit value checker;
   b) an output of the limit value checker is connected to a control input of a changeover switch;
   c) a first of the signal inputs of the changeover switch is connected to the output which supplies the first rate signal, and a second is connected to the output which supplies a second rate signal.

14. A method for indicating the frequency of events, comprising the steps of:
   generating a pulse corresponding to an event;
   selecting one of counting the number of pulses generated over a time period and correlating a time reference to said generated pulse;

calculating the frequency of events based on said selecting; and displaying an indication of the frequency of events based on said calculated frequency of events, wherein calculating the frequency of events based on correlating a time reference to said generated pulse includes:
  assigning a time to said generated pulse;
  storing said assigned time in a first circulating memory;
  determining the difference between an oldest assigned time stored in said first circulating memory and the assigned time of said generated pulse; and
  dividing a number of memory locations of said first circulating memory by said determined difference, and wherein calculating the frequency of events based on counting the number of pulses generated includes:
  recording each generated pulse in a second circulating memory;
  summing the number of recorded pulses; and
  dividing said summed number of recorded pulses by a number of memory locations of said second circulating memory.

15. The method of claim 14, wherein the selecting step automatically selects counting the number of pulses generated over a time period if the number of recorded pulses exceeds a selectable limit.

16. The method of claim 15, wherein the selecting step automatically selects correlating a time reference to said generated pulse if the number of recorded pulses does not exceed said selectable limit.

17. An event frequency counter, comprising:
  a sensor which generates a pulse corresponding to an event;
  a timer which generates a time reference;
  a first circulating memory coupled to said timer which stores a time reference corresponding to each generated pulse;
  a second circulating memory which records the occurrence of each generated pulse;
  a selectable calculator which calculates the frequency of events; and
  a display which displays the calculated frequency of events,
  wherein said selectable calculator is operable in a first mode that calculates the frequency of events by:
    determining the difference between an oldest assigned time stored in said first circulating memory and the assigned time of a last generated pulse; and
    dividing a number of memory locations of said first circulating memory by said determined difference, and
  wherein said selectable calculator is operable in a second mode that calculates the frequency of events by:
    summing the number of recorded pulses; and
    dividing said summed number of recorded pulses by a number of memory locations of said second circulating memory.

18. The apparatus of claim 17, wherein the selectable calculator automatically operates in said first mode when said number of recorded pulses does not exceed a selectable limit.

19. The apparatus of claim 17, wherein said selectable calculator automatically operates in said second mode when said number of recorded pulses exceeds a selectable limit.

20. The apparatus of claim 5, wherein the indication value is deformed nonlinearly by being deformed logarithmically.

* * * * *